United States Patent [19]
Kasai

[11] Patent Number: 5,760,600
[45] Date of Patent: Jun. 2, 1998

[54] TEST DEVICE FOR INSULATED-GATE FIELD EFFECT TRANSISTOR AND TESTING CIRCUIT AND TESTING METHOD USING THE SAME

[75] Inventor: Naoki Kasai, Tokyo, Japan

[73] Assignee: NEC Corporation, Tokyo, Japan

[21] Appl. No.: 917,757

[22] Filed: Aug. 27, 1997

Related U.S. Application Data

[63] Continuation of Ser. No. 695,956, Aug. 13, 1996, abandoned.

[30] Foreign Application Priority Data

Aug. 28, 1995 [JP] Japan ................................. 7-218875

[51] Int. Cl.$^6$ ............................................. G01R 31/26
[52] U.S. Cl. ........................................................ 324/769
[58] Field of Search ................................ 324/768, 769, 324/761

[56] References Cited

U.S. PATENT DOCUMENTS 3,795,859  3/1974  Benante et al. ..................... 324/769
5,166,608  11/1992  Bowles ................................ 324/769
5,287,055  2/1994  Cini et al. ........................... 324/768

FOREIGN PATENT DOCUMENTS 4373145  12/1992  Japan.

Primary Examiner—Ernest F. Karlsen
Assistant Examiner—Anh Phung
Attorney, Agent, or Firm—Whitham, Curtis, Whitham

[57] ABSTRACT

A test device which allows a measurement of a characteristic of an insulated-gate field effect transistor excepting the contact resistance, and a simultaneous measurement of a characteristic of the transistor including the contact resistance and the contact resistance itself, as well as a testing circuit and a testing method which use the test device. The test device includes in addition to a contact (contact for drain) and another contact (contact for source) in the proximity of a gate electrode, contacts remote from the gate electrode are provided in expanded areas of a rectangular impurity diffusion region, and two pairs of terminals wired branched from the contacts are provided. One terminal of each of the pairs of terminals and terminals wired from the remote contacts are used as measurement terminals.

5 Claims, 6 Drawing Sheets

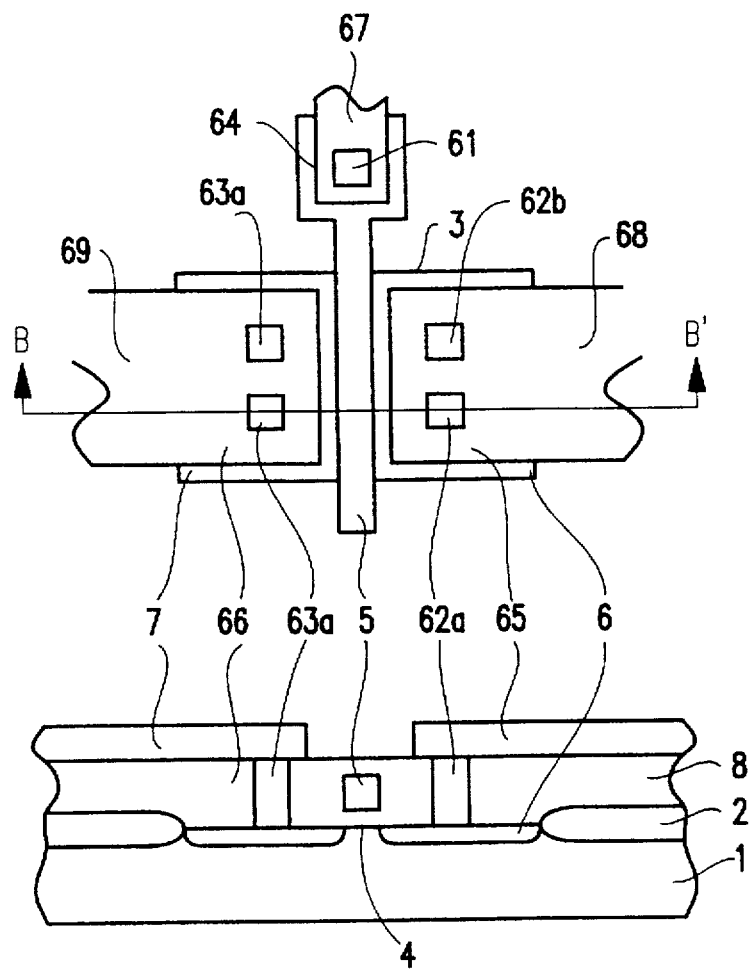
FIG. 1A PRIOR ART
FIG. 1B PRIOR ART
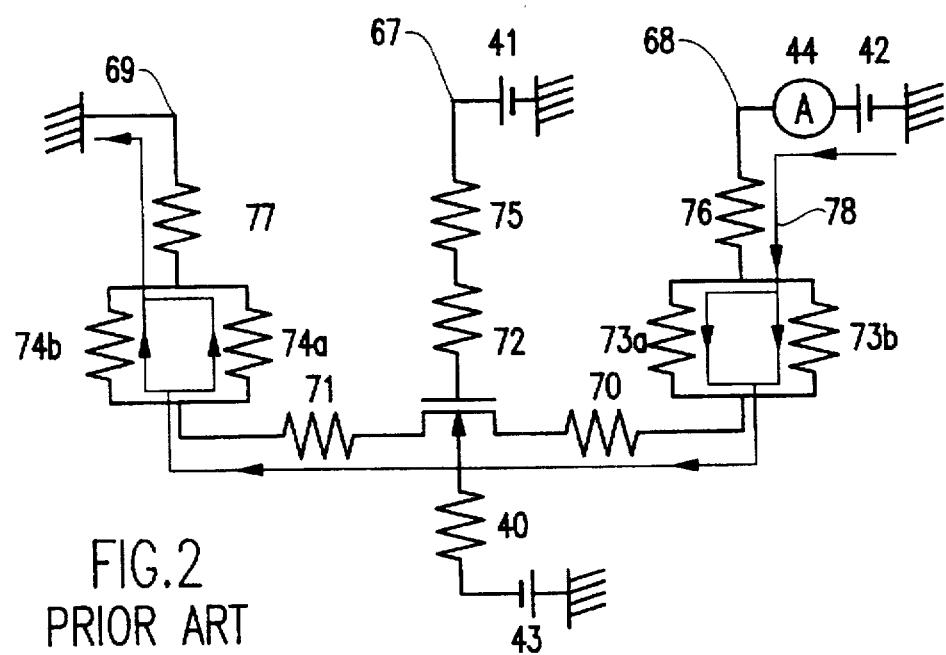
FIG. 2 PRIOR ART

TEST DEVICE FOR INSULATED-GATE FIELD EFFECT TRANSISTOR AND TESTING CIRCUIT AND TESTING METHOD USING THE SAME

This is a Continuation of application Ser. No. 08/695,956 filed Aug. 13, 1996, now abandoned.

BACKGROUND OF THE INVENTION

1. Field of the Invention

This invention relates to a test device for precisely testing a characteristic of an insulated-gate field effect transistor and a testing circuit and a testing method which use the test device.

2. Description of the Prior Art

Insulated-gate field effect transistors have been progressively improved in the reduction in size with the progress of the fine pattern fabrication techniques, and the performances of the devices have been improved in accordance with the scaling rule. While the scaling rule takes a channel region of a metal/insulator/semiconductor structure of an insulated-gate field effect transistor into particular consideration, actually since parasitic resistances of impurity diffusion layers, contacts and wirings are present in series connection, it is necessary to take these parasitic resistances into consideration. In the scaling rule of a fixed electric field, the channel resistance remains fixed even if the device is scaled down in dimension, but the resistances of impurity diffusion layers and the resistances of wirings increase in inverse proportion to the reduction in scale of the device, and besides, the contact resistances of contacts increase in inverse proportion to the square of the reduction in scale of the device. If the scale of a device is further reduced in this manner in the future, the parasitic resistances, above all the contact resistances, become a significant factor which determines the characteristic of the device. Further, as the reduction in scale of devices progresses, a dispersion in characteristics of devices has an increasing influence on the performance or the stability in operation of an LSI in which a large number of such devices are used. In this instance, it becomes progressively more important to perform a test to correctly discriminate which one of the dispersion of the channel regions themselves of the devices and the dispersion of the parasitic resistances, above all the dispersion of the contact resistances, causes a principal dispersion.

In the following, a conventional test device for an insulated-gate field effect transistor and a testing circuit and a testing method which use the test device are described with reference to the drawings. FIG. 1(a) is a plan view showing an example of a construction of a conventional test device, and FIG. 1(b) is a sectional view showing the structure taken along line B-B' of FIG. 1(a). Active region 3 defined by field oxide 2 is provided on the surface of p-type silicon substrate 1, and gate electrode 5 is formed on gate oxide 4 formed on active region 3 in such a manner that gate electrode 5 intersects active region 3. First n-type impurity diffusion layer 6 and second n-type impurity diffusion layer 7 are formed in the surface of the active region 3 on the opposite sides of gate electrode 5. On insulator film 8 formed on the surfaces of the above n-type impurity diffusion layers 6, 7, gate electrode 5 and field oxide 2, gate wiring 64 connected from gate electrode 5 via gate contact 61 is formed and connected to gate terminal 67. Meanwhile, first n-type impurity diffusion layer 6 is connected to drain wiring 65 extending to drain terminal 68 via a pair of drain contacts 62a and 62b, and similarly, second n-type impurity diffusion layer 7 is connected to source wiring 66 extending to source terminal 69 via a pair of source contacts 63a and 63b.

FIG. 2 shows a testing circuit which employs the test device shown in FIGS. 1(a) and 1(b). Power supply 41 is connected to gate terminal 67; another power supply 42 is connected to drain terminal 68 via ammeter 44; a further power supply 43 is connected to the p-type silicon substrate 1; and source terminal 69 is grounded. Between drain terminal 68 and source terminal 69, current path 78 is formed flowing through drain wiring resistance 76, a pair of drain contact resistances 73a and 73b, first impurity diffusion layer resistance 70, a channel resistance of the transistor modulated by the gate voltage, second impurity diffusion layer resistance 71, a pair of source contact resistances 74a and 74b and a source wiring resistance 77, and the current of current path 78 is measured as the current of the insulated-gate field effect transistor by ammeter 44.

When the characteristic of an insulated-gate field effect transistor is tested using such a testing device as shown in FIG. 2, the electric current flowing through the insulated-gate field effect transistor is greatly influenced not only by the resistance of the channel region modulated by the gate voltage but also particularly by the resistance of contacts, that is, the contact resistance, and it is impossible to make a test separately for the channel resistance which is the inherent current driving capacity of the transistor and for the contact resistance itself.

As a method of measuring the contact resistance and the characteristic of an insulated-gate field effect transistor independently of each other, a construction of a semiconductor device MOSFET and a testing circuit and a testing method which use the semiconductor device are disclosed in Japanese Patent Laid-Open No. 373145/92. FIGS. 3(a) and 3(b) show the construction of the semiconductor device and the testing circuit disclosed in the document mentioned above, respectively. Referring to FIGS. 3(a) and 3(b), reference numeral 81 denotes a polysilicon which forms a gate electrode, 82 an n-type impurity diffusion layer which forms source-drain regions, 83 a metal wiring which is connected to the source, drain and gate regions via metal/silicon contacts, 67 a gate terminal, 69 a source terminal, 84 a first drain terminal, 85 a second drain terminal, 86 a third drain terminal, and 87 a fourth drain terminal. Reference numeral 88 denotes a drain contact resistance, 89 an ammeter, 90 a voltmeter, 91 a power supply, and 100 a terminal of p-type silicon substrate.

With the construction shown in FIGS. 3(a) and 3(b), however, although the contact resistance can be measured separately, it is impossible to measure the characteristic of the insulated-gate field effect transistor excepting the contact resistance. Further, different from test devices which have conventionally been used, the n-type impurity diffusion layer on the drain side has a branching pattern and is complicated in configuration. Consequently, the current path used when the characteristic of the insulated-gate field effect transistor is measured and the current path used when the contact resistance is measured are different from each other. In particular, in measurement of the characteristic of the insulated-gate field effect transistor, current flows through first drain terminal 84, a drain contact hole connected to the first drain terminal nearest to the gate electrode, the drain n-type impurity diffusion layer, the channel of the insulated-gate field effect transistor, the source n-type impurity diffusion layer, a source contact hole connected to the source terminal and the source terminal 69. On the other hand, in measurement of the contact resistance, the current flows through fourth drain terminal 87, a drain contact hole connected to the fourth drain terminal, the drain side n-type impurity diffusion layer between a drain contact hole connected to fourth drain terminal 87 and another drain contact hole connected to third drain terminal 86, the drain contact hole connected to the third drain terminal 86 and the third drain terminal 86. Where the number of contact holes in the proximity of the gate electrode is only one as seen in FIG. 3(a), the contact resistance measured is equal to that when the characteristic of the insulated-gate field effect transistor is measured although the current paths are different. However, where a plurality of contact holes (contacts) are present as in the example of the prior art (FIGS. 1(a) and 1(b)), the measured contact resistance includes resistances of the n-type impurity diffusion layer of the drain side between the plurality of contact holes, and accordingly, it is impossible to determine the contact resistance precisely. Further, with the testing circuit shown in FIG. 3(b), when the contact resistance is measured, since a current source 91 different from the power supply used to measure the characteristic of an insulated-gate field effect transistor is used, it is impossible to simultaneously perform a measurement of the characteristic of an insulated-gate field effect transistor and a measurement of the contact resistance.

SUMMARY OF THE INVENTION

It is an object of the present invention to provide a test device for an insulated-gate field effect transistor which can be used to construct a testing circuit which can measure a characteristic of an insulated-gate field effect transistor excepting the contact resistance and another testing circuit which can measure a characteristic of an insulated-gate field effect transistor including the contact resistance simultaneously with the contact resistance itself.

It is a further object of the present invention to provide a testing circuit and a testing method which use the test device.

It is still another object of the invention that, even if the contact resistance exhibits a dispersion due to an influence of the number of contacts or a dispersion in contact resistance of a metal/silicon interface, an inherent characteristic of a channel region of the insulated-gate field effect transistor can be tested precisely.

According to the present invention, there is provided a test device for an insulated-gate field effect transistor formed in a predetermined region of a semiconductor substrate, comprising magnified first and second impurity diffusion regions expanded to both directions over a drain and a source on the opposite sides of a gate electrode of the insulated-gate field effect transistor which is an object of a test, and measurement terminals wired via contacts provided additionally in the expanded areas of the first and second impurity diffusion regions. Preferably, the test device for an insulated-gate field effect transistor further comprising measurement terminals wired branched from the contacts to which the terminal of the drain or the terminal of the source is connected by wiring.

There is provided a test device for an insulatedgate field effect transistor, the test device comprising a first terminal connected to the gate electrode via a first contact formed on the gate electrode and a first wiring extending from the first contact, two second and third terminals connected to a first impurity diffusion layer via a second contact formed in the proximity of the gate electrode in the first impurity diffusion region and a second wiring branched from the second contact, a fourth terminal connected to the first impurity diffusion layer via a third contact formed in the first impurity diffusion region more remote from the gate electrode than the second contact and a third wiring extending from the third contact, two fifth and sixth terminals connected to the second impurity diffusion layer via a fourth contact formed in the proximity of the gate electrode in the second impurity diffusion region and a fourth wiring branched from the fourth contact, and a seventh terminal connected to the second impurity diffusion layer via a fifth contact formed in the second impurity diffusion region more remote from the gate electrode than the fourth contact and a fifth wiring extending from the fifth contact.

There is provided a testing circuit for an insulated-gate field effect transistor which uses the test device described above, the testing circuit comprising an ammeter connected between the fourth terminal connected to a power supply and the seventh terminal grounded, a voltmeter connected between the third terminal and the sixth terminal, another voltmeter connected between the first terminal and the sixth terminal, and a further voltmeter connected between the sixth terminal and the substrate.

There is provided a testing method for an insulated-gate field effect transistor which uses a testing circuit described above, the testing method measuring a characteristic of the insulated-gate field effect transistor excepting the contact resistances of the second and fourth contacts, under the setting of a voltage at the sixth terminal as a source voltage which serves as a reference voltage, a voltage difference between the third terminal and the sixth terminal as a drain voltage, a voltage between the first terminal and the sixth terminal as a gate voltage, and a voltage between the substrate and the sixth terminal as a substrate voltage.

There is provided another testing circuit for an insulated-gate field effect transistor which uses the test device described above, the testing circuit comprising an ammeter connected between the second terminal connected to a power supply and the fifth terminal grounded, a voltmeter connected between the second terminal and the fifth terminal, another voltmeter connected between the first terminal and the fifth terminal, a further voltmeter connected between the fifth terminal and the substrate, a still further voltmeter connected between the third terminal and the fourth terminal, and a yet further voltmeter connected between the sixth terminal and the seventh terminal.

There is provided another testing method for an insulated-gate field effect transistor which uses the second testing circuit described above, the testing method measuring a characteristic of the insulated-gate field effect transistor including the contact resistances of the second and fourth contacts, and measuring the resistance of the second contact from a voltage difference and a current between the third terminal and the fourth terminal as well as the resistance of the fourth contact from a voltage difference and a current between the sixth terminal and the seventh terminal, under the setting of a voltage at the fifth terminal as a source voltage which serves as a reference voltage, a voltage difference between the second terminal and the fifth terminal as a drain voltage, a voltage between the first terminal and the fifth terminal as a gate voltage and a voltage between the substrate and the fifth terminal as a substrate voltage.

BRIEF DESCRIPTION OF THE DRAWINGS

FIGS. 1(a) and 1(b) are a plan view and a sectional view, respectively, showing an example of a construction of a test device of the prior art;

FIG. 2 is a circuit diagram showing a testing circuit which uses the test device shown in FIGS. 1(a) and 1(b);

DESCRIPTION OF THE PREFERRED EMBODIMENTS

Preferred embodiments of the present invention are described below with reference to the drawings.

Figure 3A:
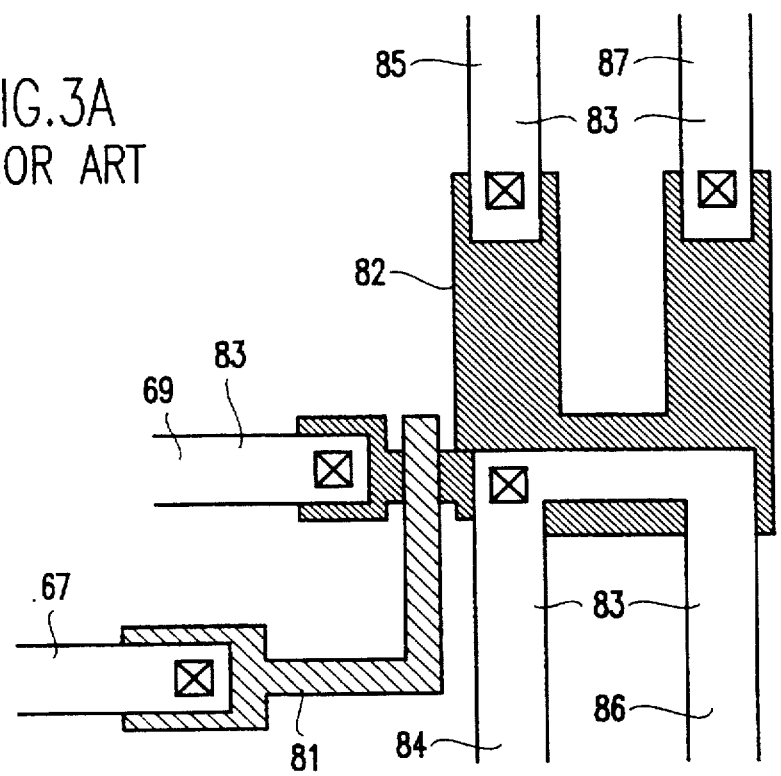
FIGS. 3(a) and 3(b) are a schematic view showing an example of a construction of a test device and a circuit diagram showing a testing circuit for the test device, respectively, disclosed in Japanese Patent Laid-open No. 373145/92.
Figure 3B:
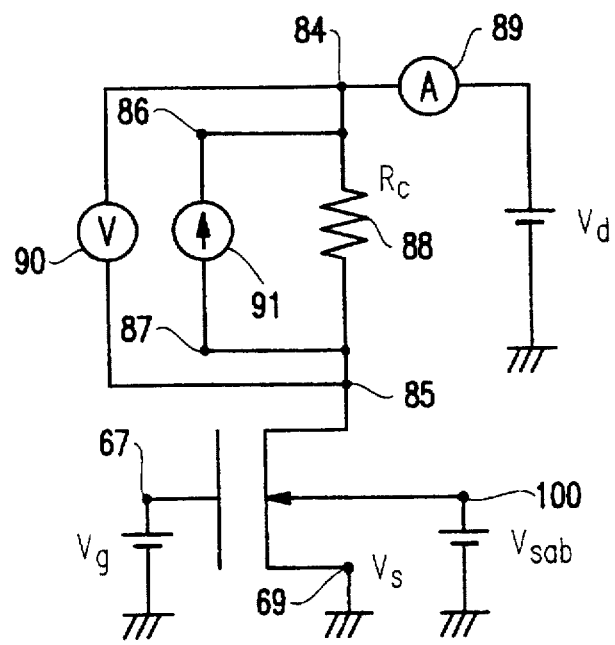
Figures 4A, 4B:
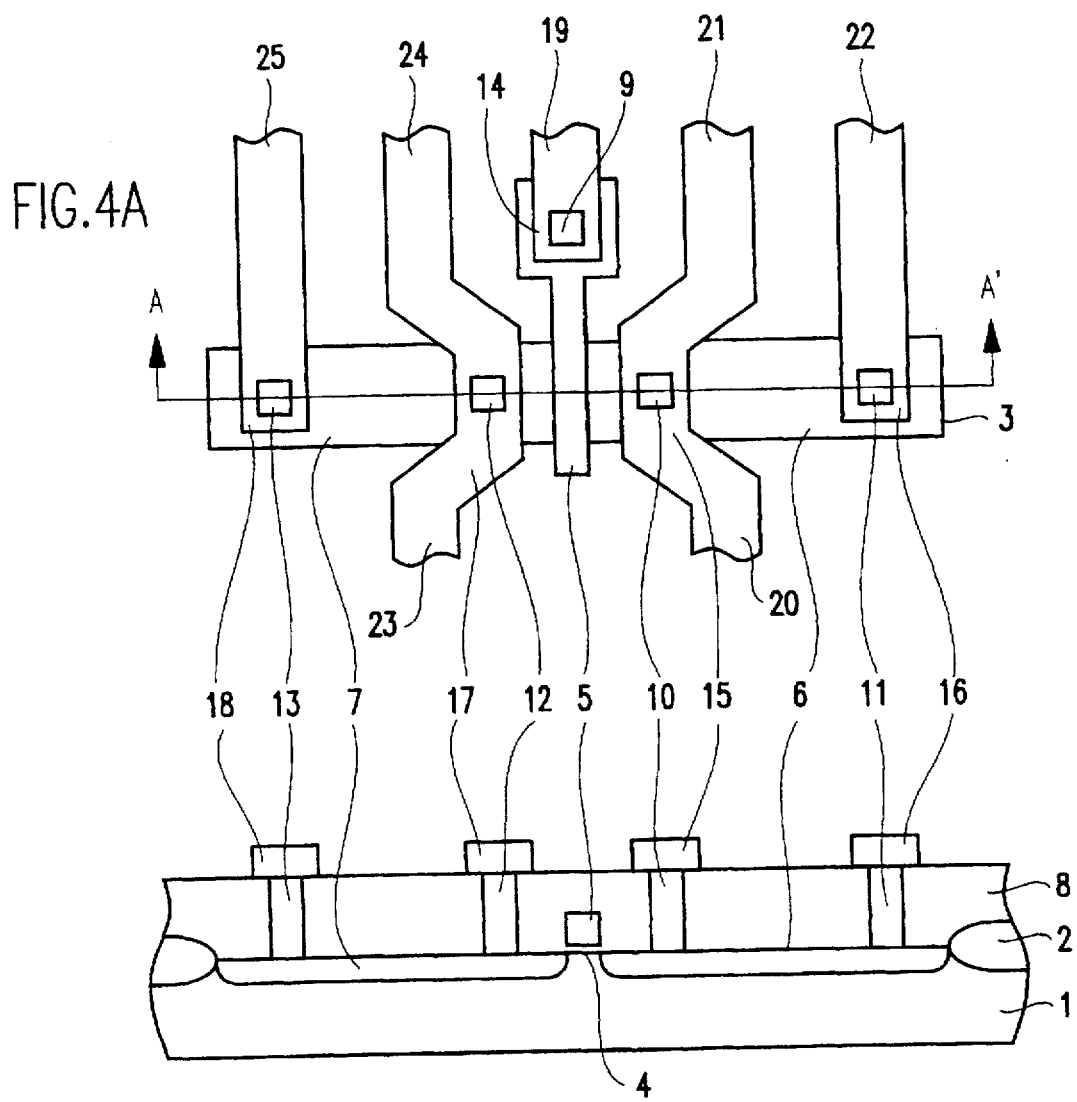
FIGS. 4(a) and 4(b) are a plan view and a sectional view, respectively, showing a structure of a test device according to a first embodiment of the present invention.

FIGS. 4(a) and 4(b) are a plan view and a sectional view, respectively, showing a structure of a test device for an insulated-gate field effect transistor according to a first embodiment of the present invention. Rectangular active region 3 defined by field oxide 2 is formed on the surface of p-type silicon substrate 1, and gate electrode 5 made of polysilicon is formed on gate oxide 4 formed on the surface of the active region in such a manner that gate electrode 5 intersects active region 3. First n-type impurity diffusion layer 6 and second n-type impurity diffusion layer 7 are formed on the opposite sides of gate electrode 5 in the surface of active region 3, and insulator film 8 formed from a silicon oxide film is deposited on the surfaces of the above n-type impurity diffusion layers 6, 7, gate electrode 5 and field oxide 2. 14 First wiring 14 connected to gate electrode 5 via a first contact 9 is formed and extended to a first terminal 19. Two contacts 10, 11 are formed at different distances from gate electrode 5 on first n-type impurity diffusion layer 6, and second wiring 15 connected to second contact 10 formed in the proximity of gate electrode 5 is formed. Second wiring 15 is branched into two parts individually extended to a second terminal 20 and a third terminal 21. Third wiring 16 formed remote from gate electrode 5 and connected to third contact 11 is extended to fourth terminal 22. Also on second n-type impurity diffusion layer 7, two contacts 12, 13 are formed at different distances from gate electrode 5, and fourth wiring 17 connected to fourth contact 12 formed in the proximity of gate electrode 5 is branched into two parts individually extended to fifth terminal 23 and sixth terminal 24. Fifth wiring 18 connected to fifth contact 13 formed remote from gate electrode 5 is extended to seventh terminal 25.

The semiconductor test device described above is designed for the use of testing an insulated-gate field effect transistor which is constructed for a practical circuit use on a substrate, and has the same structure as that of the insulated-gate field effect transistor for the practical circuit use except that the test 15 device additionally has terminals to be used for a measurement for a test, that is, the fourth and seventh terminals 22 and 25 via third and fifth contacts 11 and 13 located remote from the gate electrode and the terminals located in the proximity of the gate electrode and wired in a branching manner from the second and fourth contacts 10 and 12 originally provided for current driving.

Figure 5:
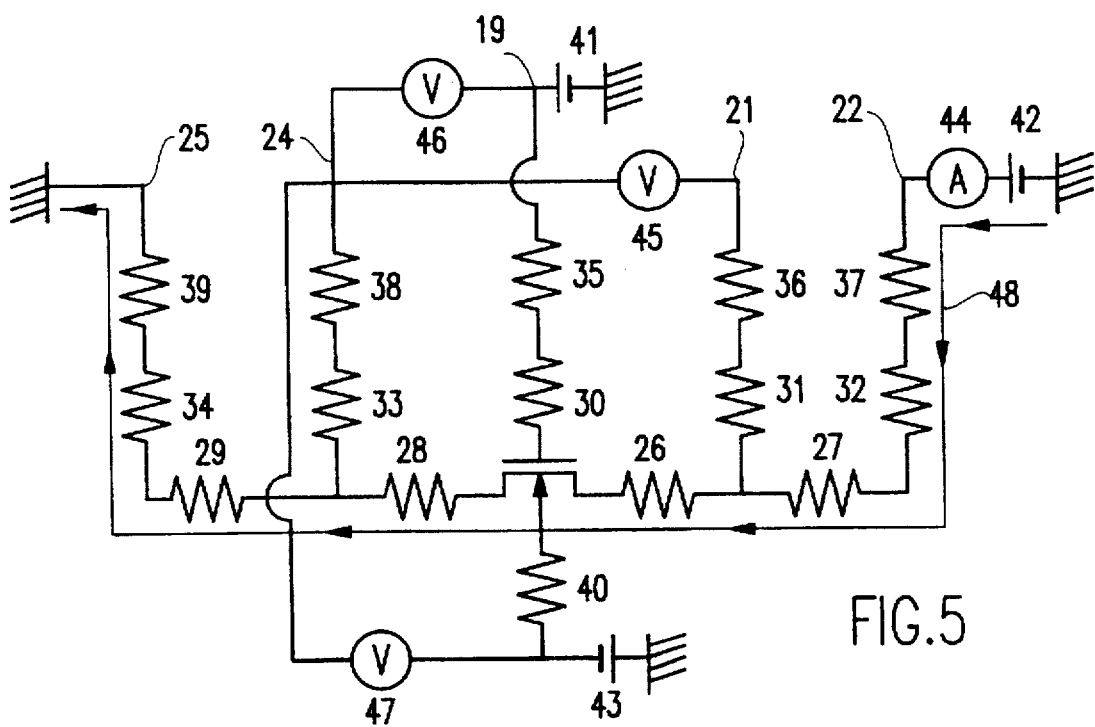
FIG. 5 is a circuit diagram showing a testing circuit which uses the test device shown in FIGS. 4(a) and 4(b)

FIG. 5 shows a testing circuit which uses the test device shown in FIGS. 4(a) and 4(b). Reference numeral 26 denotes a first impurity diffusion layer resistance of first n-type impurity diffusion layer 6 shown in FIGS. 4(a) and 4(b) between the channel of the transistor and second contact 10, 27 a second impurity diffusion layer resistance of first n-type impurity diffusion layer 6 between second contact 10 and third contact 11, 28 a third impurity diffusion layer resistance of second n-type impurity diffusion layer 7 between the channel of the transistor and fourth contact 12, 29 a fourth impurity diffusion layer resistance of second n-type impurity diffusion layer 7 between fourth contact 12 and fifth contact 13, 30 a first contact resistance of first contact 9, 31 a second contact resistance of second contact 10, 32 a third contact resistance of third contact 11, 33 a fourth contact resistance of fourth contact 12, 34 a fifth contact resistance of fifth contact 13, 35 a first wiring resistance of first wiring 14 from first contact 9 to first terminal 19, 36 a second wiring resistance of one of the branching wirings of second wiring 15 from second contact 10 to third terminal 21, 37 a third wiring resistance of the third wiring from third contact 11 to fourth terminal 22, 38 a fourth wiring resistance of one of the branching wirings of fourth wiring 17 from fourth contact 12 to sixth terminal 24, 39 a fifth wiring resistance of fifth wiring 18 from fifth contact 13 to the seventh terminal 25, and 40 a substrate resistance. Reference numeral 41 denotes a power supply to gate electrode 5, 42 a power supply to the first impurity diffusion layer, and 43 a power supply to the substrate. Reference numeral 44 denotes an ammeter for measuring current flowing to fourth terminal 22, 46 a voltmeter for measuring a voltage difference between third terminal 21 and sixth terminal 24, and 47 a voltmeter for measuring a voltage difference between the substrate and sixth terminal 24. Reference numeral 48 denotes a path of current flowing through the transistor.

It is to be noted that, in FIGS. 4(a) and 4(b), second terminal 20 connected branched from the second contact 10 and fifth terminal 23 connected branched from fourth contact 12 are not used for the construction of the testing circuit of FIG. 5 (in other words, for the construction of the testing circuit of FIG. 5, no terminals need to be branched from the second and fourth contacts 10 and 12).

A characteristic of a transistor can be measured using the testing circuit shown in FIG. 5 excepting contact resistances (a resistance of wiring can generally be ignored). Referring to FIG. 5 with FIGS. 4(a) and 4(b), current flows successively through fourth terminal 22, third wiring 16, third contact 11, first n-type impurity diffusion layer 6, the channel region of the transistor, second n-type impurity diffusion layer 7, fifth contact 13, fifth wiring 18 and seventh terminal 25. Contact resistances 31, 33 of second and fourth contacts and wiring resistances 36, 38 are not included in the above current path. Since current does not flow through sixth terminal 24 and third terminal 21, voltage drops do not arise due to the above resistances. Accordingly, the voltage of sixth terminal 24 is a voltage at the point immediately below fourth contact 12 in the second n-type impurity diffusion layer 7, that is the source voltage, and the voltage of third terminal 21 is a voltage at the point immediately below second contact 10 in the first n-type impurity diffusion layer 6, that is the drain voltage. The current between the source and the drain is measured by ammeter 44, and the voltage difference between the source and the drain (between sixth terminal 24 and third terminal 21) is measured by voltmeter 45, and then the characteristic of the transistor can be measured excepting the voltage drop due to second contact resistance 31 of second contact 10 and the voltage drop due to fourth contact resistance 33 of fourth contact 12 (neglecting the resistances 36 and 38 of the wirings 15 and 17).

Figure 6:
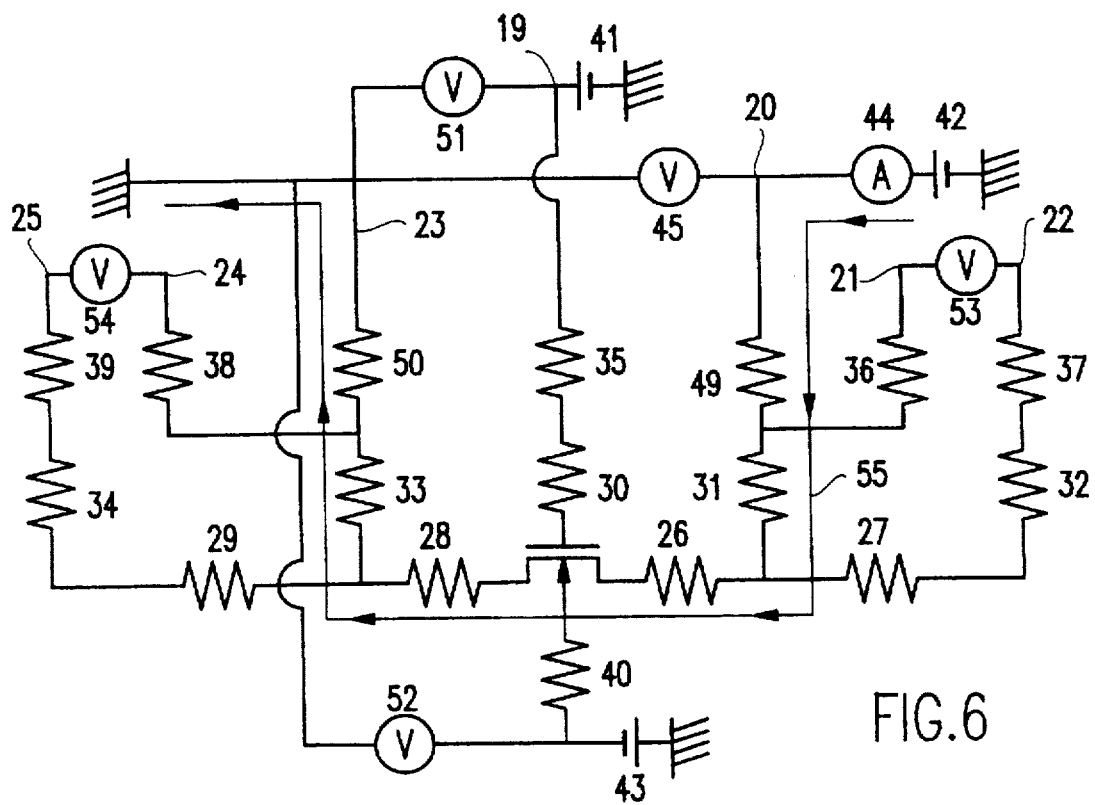
FIG. 6 is a circuit diagram showing another testing circuit which uses the test device shown in FIGS. 4(a) and 4(b)

FIG. 6 shows another testing circuit which uses the test device shown in FIGS. 4(a) and 4(b). A transistor characteristic including the contact resistance and the contact resistance itself can be measured simultaneously using the testing circuit shown in FIG. 6. In FIG. 6, second terminal 20 is used as the drain of the transistor; fifth terminal 23 is used as the source whose voltage serves as a reference voltage; the first terminal is used as the gate; and the substrate is connected in the same manner as FIG. 5, and voltmeters 45, 51 and 52 are provided for measuring voltages with reference to the source terminal. The current flowing between the source and the drain measured by ammeter 44. Second contact resistance 31 which is the contact resistance of the drain of the transistor is measured from the voltage difference between third terminal 21 and fourth terminal 22 by voltmeter 53 and fourth contact resistance 33 which is the contact resistance of the source is measured from the voltage difference between sixth terminal 24 and seventh terminal 25 by voltmeter 54, and then the characteristic of the transistor and the contact resistance itself can be measured at the same time in path 55 of current flowing between the source and the drain.

Figures 7A, 7B:
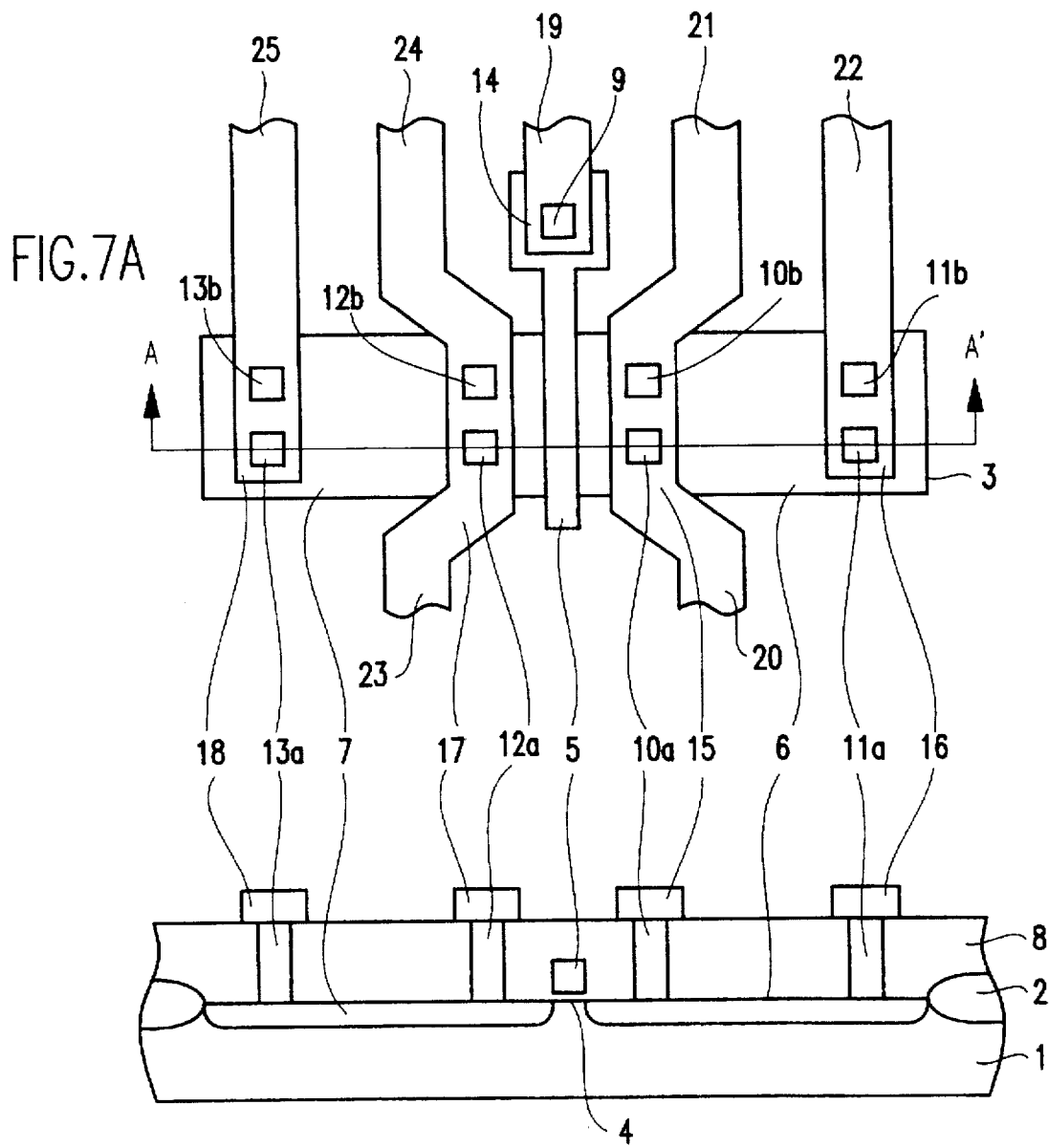
FIGS. 7(a) and 7(b) are a plan view and a sectional view, respectively, showing a structure of a test device according to a second embodiment of the present invention.

FIGS. 7(a) and 7(b) are a plan view and a sectional view, respectively, showing a structure of a test device for an insulated-gate field effect transistor according to a second embodiment of the present invention. The second embodiment is different from the first embodiment in that the width of the active region is greater than that in the first embodiment and the number of contacts connected to each of the second wiring 15, third wiring 16, fourth wiring 17 and fifth wiring 18 is two.

Figure 8:
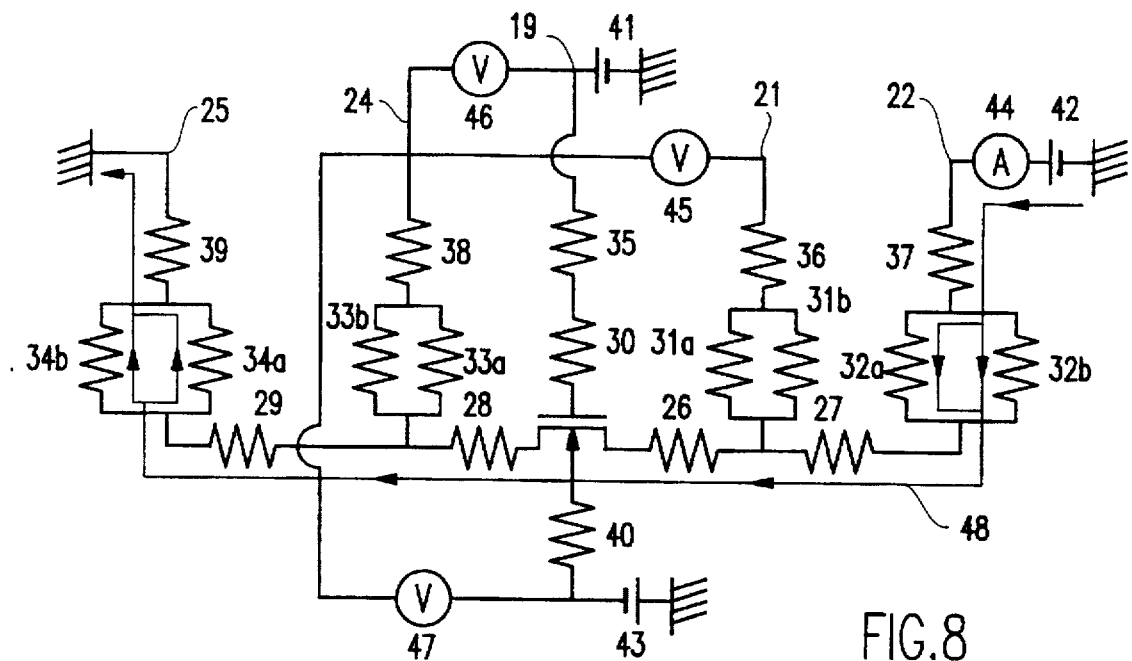
FIG. 8 is a circuit diagram showing a testing circuit which uses the test device shown in FIGS. 7(a) and 7(b)
Figure 9:
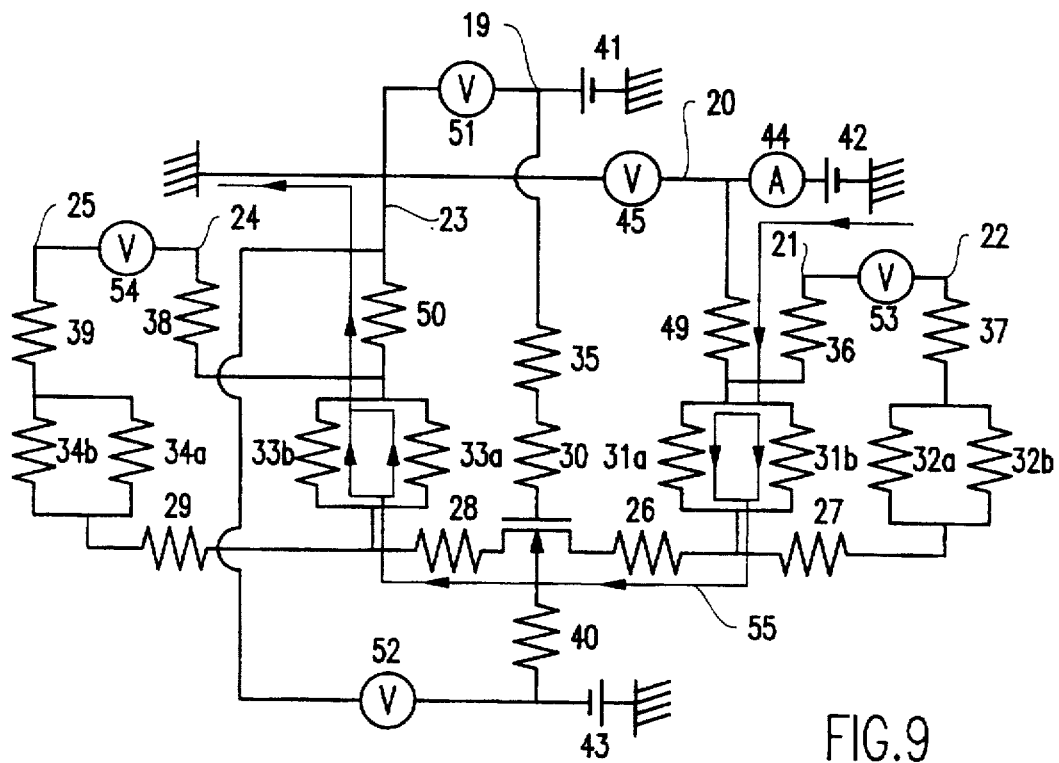
FIG. 9 is a circuit diagram showing another testing circuit which uses the test device shown in FIGS. 7(a) and 7(b).

FIG. 8 shows a testing circuit which uses the test device shown in FIGS. 7(a) and 7(b), and FIG. 9 shows another testing circuit which uses the test device shown in FIGS. 7(a) and 7(b). In both testing circuits, as the gate width is increased so as to increase the current capacity, the number of contacts formed for each of the impurity diffusion layers is increased to two, and consequently, the resistances of the contacts between the impurity diffusion layers and the wirings are in parallel arrangement.

The impurity diffusion layers of both test devices shown in FIGS. 4(a), 4(b) and 7(a), 7(b) may have rectangular shapes, and accordingly, an ordinary active region of a rectangular shape can be used in pattern designing.

While examples of an n-channel insulated-gate field effect transistor are described above in the first and second embodiments of the present invention, the present invention is not limited to this and can be applied also to a p-channel insulated-gate field effect transistor.

Further, while the number of contacts between each n-type impurity diffusion layer and a wiring in the second embodiment of the present invention is two, the number is not limited to two but may be three or more.

As described above, according to the test device for an insulated-gate field effect transistor of the present invention, since measurement terminals located outwardly of contacts for the drain and the source of the device to be tested and measurement terminals connected branched from the contacts for the drain and the source are provided, there are advantages that a testing circuit and a testing method can be constructed and realized which can test a characteristic of the insulated-gate field effect transistor excepting the contact resistance as well as a characteristic including the contact resistance and the contact resistance itself at the same time.

Further, since a characteristic of an insulatedgate field effect transistor excepting the contact resistance can be measured, there are advantages that, even if the contact resistance exhibits a dispersion due to an influence of the number of contacts or a dispersion in contact resistance of a metal/silicon interface, an inherent characteristic of a channel region of the insulated-gate field effect transistor can be tested precisely.

What is claimed is:

1. A test device for an insulated-gate field effect transistor formed in a predetermined region of a semiconductor substrate, comprising:

first and second impurity diffusion regions expanded in both directions over a drain and a source on the opposite sides of a gate electrode of the insulated-gate field effect transistor which is an object of a test;

a first terminal connected to said gate electrode via a first contact formed on said gate electrode and a first wiring extending from said first contact;

a second terminal connected to said first impurity diffusion region via a second contact formed in the proximity of said gate electrode in said first impurity diffusion region and a second wiring branched from said second contact;

a third terminal connected to said first impurity diffusion region via a third contact formed in said first impurity diffusion region more remote from said gate electrode than said second contact and a third wiring extending from said third contact;

a fourth terminal connected to said second impurity diffusion region via a fourth contact formed in the proximity of said gate electrode in said second impurity diffusion region and a fourth wiring branched from said fourth contact; and a fifth terminal connected to said second impurity diffusion region via a fifth contact formed in said second impurity diffusion region more remote from said gate electrode than said fourth contact and a fifth wiring extending from said fifth contact.

2. A testing circuit for an insulated-gate field effect transistor which uses the test device according to claim 1, said testing circuit comprising:

an ammeter connected between said third terminal connected to a power supply and said fifth terminal grounded, a first voltmeter connected between said second terminal and said fourth terminal, a second voltmeter connected between said first terminal and said fourth terminal, and a third voltmeter connected between said fourth terminal and said substrate.

3. A testing method for an insulated-gate filed effect transistor which uses a testing circuit according to claim 2, said testing method measuring a characteristic of the insulated-gate field effect transistor excepting the contact resistances of said second and fourth contacts under the setting of a voltage at said fourth terminal as a source voltage which serves as a reference voltage, a voltage difference between said second terminal and said fourth terminal as a drain voltage, a voltage between said first terminal and said fourth terminal as a gate voltage, and a voltage between said substrate and said fourth terminal as a substrate voltage.

4. A testing circuit for an insulated-gate field effect transistor which uses the test device according to claim 1, said testing circuit further comprising:

- an ammeter connected between said second terminal connected to a power supply and said fourth terminal grounded;
- a first voltmeter connected between said second terminal and said fourth terminal;
- a second voltmeter connected between said first terminal and said fourth terminal;
- a third voltmeter connected between said fourth terminal and said substrate;
- a fourth voltmeter connected between said second terminal and said third terminal; and
- a fifth voltmeter connected between said fourth terminal and said fifth terminal.

5. A testing method for an insulated-gate filed effect transistor which uses a testing circuit according to claim 4, said testing method measuring a characteristic of the insulated-gate field effect transistor including the contact resistances of said second and fourth contacts, and measuring the resistance of said second contact from a voltage difference and a current between said second terminal and said third terminal as well as the resistance of said fourth contact from a voltage difference and a current between said fourth terminal and said fifth terminal, under the setting of a voltage at said fourth terminal as a source voltage which serves as a reference voltage, a voltage difference between said second terminal and said fourth terminal as a drain voltage, a voltage between said first terminal and said fourth terminal as a gate voltage, and a voltage between said substrate and said fourth terminal as a substrate voltage.

* * * * *